United States Patent [19]

Brodsky et al.

[11] Patent Number: 4,972,246

[45] Date of Patent: Nov. 20, 1990

[54] EFFECTIVE NARROW BAND GAP BASE TRANSISTOR

[75] Inventors: Marc H. Brodsky, Mount Kisco; Frank F. Fang; Bernard S. Meyerson, both of Yorktown Heights, all of N.Y.

[73] Assignee: International Business Machines Corp., Armonk, N.Y.

[21] Appl. No.: 171,603

[22] Filed: Mar. 22, 1988

[51] Int. Cl.$^5$ .............................. H01L 29/73
[52] U.S. Cl. ................................ 357/34; 357/4
[58] Field of Search .................... 357/4, 16, 34

[56] References Cited

U.S. PATENT DOCUMENTS

| 4,119,994 | 10/1978 | Jain et al. | 357/16 |
| 4,137,542 | 1/1979 | Chang et al. | 357/16 |
| 4,785,340 | 11/1988 | Nakagawa et al. | 357/34 |

FOREIGN PATENT DOCUMENTS

| 58-114455 | 7/1983 | Japan | 357/4 SL |
| 58-142574 | 8/1983 | Japan | 357/4 SL |
| 59-67676 | 4/1984 | Japan | 357/4 SL |
| 59-90978 | 5/1984 | Japan | 357/4 SL |
| 62-279672 | 12/1987 | Japan | |

OTHER PUBLICATIONS

K. Ploog et al., Growth and Properties of New Artificial Doping Superlattices in GaAs, Microelectronics Journal, vol. 13, No. 3, 1982.

P. Gavrilovic et al., Implantation Disordering of $Al_x$-$Ga_{1-x}$ As Superlattices, Apply. Phys. Lett. 47(2), 15 Jul. 1985.

G. H. Döhler et al., Quantization of Photoexcited Electrons in GaAs nipi Crystals, Surface Science 113 (1982), 479-480.

Primary Examiner—William D. Larkins
Attorney, Agent, or Firm—Scully, Scott, Murphy & Presser

[57] ABSTRACT

A homojunction bipolar transistor having a superlattice base region comprising alternate layers of extrinsic and intrinsic layers, with extrinsic layers being of the opposite conductivity of the emitter and collector layers of the transistor. The alternate extrinsic and intrinsic layers have substantially different doping levels providing abrupt transitions in the valence and conduction bands between layers. The abrupt transitions result in the energy band gap in the base region being effectively reduced with respect to the band gap in the emitter region. In one embodiment, the effective narrow band gap base transistor is implemented by converting a portion of the upper layers of the superlattice to a homogeneous region by heavily doping the portion to form the emitter of the transistor.

23 Claims, 2 Drawing Sheets

EFFECTIVE NARROW BAND GAP BASE TRANSISTOR

BACKGROUND OF THE INVENTION

This invention relates to wide band gap emitter transistors and more particularly, to transistors having a superlattice base region providing an effective narrow gap base.

It is well known that transistors having a wide band gap emitter have important advantages in bipolar transistor technology. The wide band gap emitter in an npn transistor provides high emitter injection efficiency by blocking the movement of holes from the base to the emitter for the same electron injection from the emitter to the base. Consequently, it allows relatively lighter emitter doping and heavier base doping which results in reduced emitter capacitance and lower base resistance. At present, the emitter efficiency of homojunction bipolar transistors having equal energy band gaps in the emitter, base and collector, is controlled by the doping levels in the emitter and base. In the prior art devices, the emitter is heavily doped to increase the injection efficiency. However, the amount of doping and hence the efficiency is limited since too heavy a doping reduces the effective band gap of the emitter and permits holes to easily move from the base to the emitter. Also in the prior art devices, the base resistance is reduced by heavily doping the base. However, this increases the inverse injection efficiency. The reduction in base resistance thus results in an increase in base currents.

Another type of wide band gap emitter in the prior art is shown in U.S. Pat. No. 4,119,994 directed to a heterojunction device formed with GaAs having a wide energy band gap for the emitter layer and using Ge having a narrow band gap for the base and collector layers. Alternatively, one can also use AlGaAs and GaAs as the emitter and the base, respectively. Another approach in the prior art is to fabricate the transistor having the base region formed from a superlattice. As shown in U.S. Pat. No. 4,137,542, the superlattice is formed with alternate layers of different material, such as, GaAs and GaAlAs. Another example of the superlattice is disclosed in Surface Science 113(1982) 479–480 disclosing a periodic sequence of n and p doped GaAs layers with intrinsic layers inbetween.

The use of a superlattice in a wide band gap emitter transistor is disclosed in Japanese Pat. No. 58-114455 which discloses a superlattice base being formed of alternate layers of p+ doped GaAsSb and p− doped GaInAs sandwiched between emitter and collector layers of n doped GaInAs.

SUMMARY OF THE INVENTION

The present invention is directed to a homojunction bipolar transistor comprising a semiconductor body having an emitter and a collector region of a first conductivity type separated by a superlattice base region. The superlattice is made of a plurality of alternate layers of an extrinsic layer of a second conductivity type and an intrinsic layer of the same semiconductor material as the extrinsic layer. The bipolar transistor, being a homojunction device, is fabricated with the emitter, base and collector regions also each being made of the same semiconductor material. The superlattice has abrupt transitions between the alternate layers such that the effective band gap of the semiconductor in the base region is reduced with respect to the band gap of the semiconductor in at least the emitter region.

The bipolar transistor of the invention may be fabricated with any semiconductor material such as silicon, germanium, or gallium arsenide. The homojunction transistor of the invention provides a wide band gap emitter that is much easier to fabricate than the heterojunction devices of the prior art. In addition, the present invention contemplates the use of monocrystalline silicon or germanium so that the wide band gap emitter may be realized in conventional silicon or germanium bipolar transistor technology.

The abrupt transitions in the base region superlattice structure of the present invention are formed with alternate layers of the same semiconductor material having substantially different doping levels. The base region is made of a plurality of pairs of alternate layers of heavily doped extrinsic semiconductor material and intrinsic or undoped semiconductor material. The thickness of each pair of doped and undoped layers, referred to as the period of the superlattice, is sufficiently small so that there is a resonant state for both electrons and holes across the base region. If the relative doping of the superlattice is sufficiently large, there will be large band bending which reduces the energy spacing of the resonant states between the conduction and valence bands. Thus, the effective band gap of the base region is narrowed.

In addition, a novel method of implementing the bipolar transistor of the invention is also disclosed. A semiconductor body having a collector layer of a first conductivity type and a superlattice region contiguous to the collector layer. The superlattice is formed as described above with a plurality of pairs of alternate layers of an extrinsic layer of a second conductivity type and an intrinsic layer of the same semiconductor material as the collector layer. A central lengthwise portion of several upper layers of the superlattice are converted to the first conductivity type. The converted region forms the emitter of the bipolar transistor and the remaining unconverted layers of the superlattice form the base region. The number of layers converted to the opposite conductivity of the superlattice is determined by the desired thickness of the emitter and base regions. The emitter region is converted by heavily doping the upper layers of the superlattice with the opposite conductivity of the base. The level of dopant introduced into the central portion must be greater than the dopant level of the extrinsic layers of the superlattice. The heavy doping of these upper layers causes the region to be converted from a superlattice to a homogeneous structure having uniform energy bands. As a consequence, the energy band gap returns to the level of the bulk material. Side portions of the superlattice layers on either side of the emitter region are converted to homogeneous regions of the second conductivity type thereby forming a pair of ohmic contacts to the base region. The band gap of the base ohmic contacts also returns to that of the bulk material. Thus, the emitter region and the base ohmic contacts are formed merely by doping upper layers of the superlattice eliminating the need to grow additional layers.

DETAILED DESCRIPTION OF THE INVENTION

The present invention is directed to a homojunction bipolar transistor having an effective narrow band gap base so that the effective band gap in the base region is less than the band gap in the emitter region. The wide band gap emitter bipolar transistor of the invention is implemented in a semiconductor body in which the emitter, base and collector are all made of the same material, such as silicon, germanium or gallium arsenide. The band gap of the base is effectively narrowed by forming the base of a superlattice structure. The superlattice is made of a plurality of alternate layers of an extrinsic layer of heavily doped semiconductor material and an intrinsic layer of undoped semiconductor material.

Figure 1:
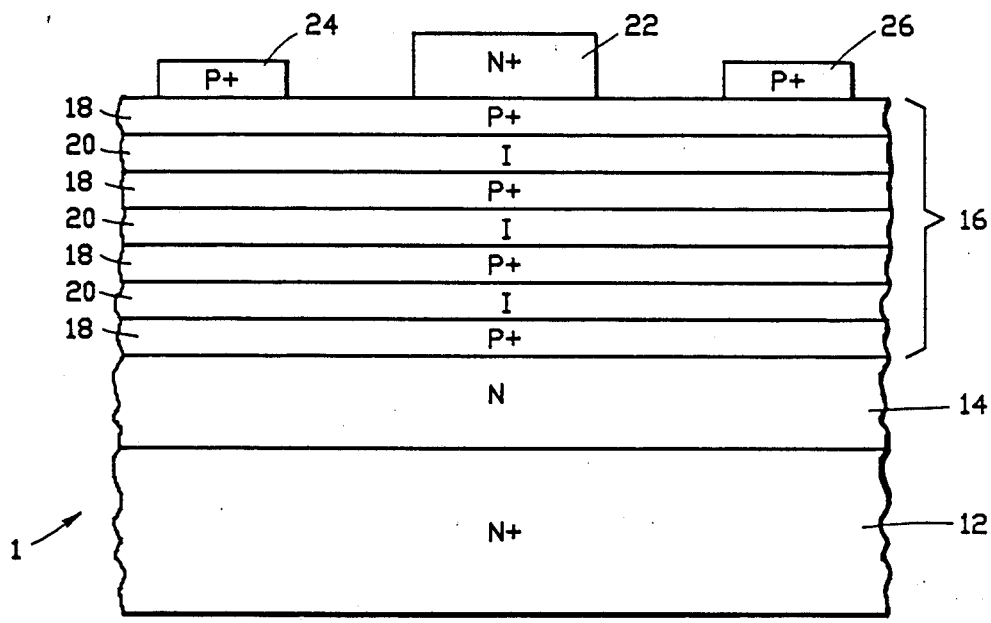
FIG. 1 is a cross-sectional schematic view of the bipolar effective narrow band gap base transistor of the present invention.

Referring now to the drawings, FIG. 1 shows a cross-sectional view of one implementation of the bipolar transistor of the present invention. The transistor 10 of FIG. 1 is shown illustratively as an npn transistor. It should be obvious to those skilled in the art that the implementation of the present invention may also be provided in a pnp transistor The transistor 10 of FIG. 1 includes a collector region 12 heavily doped n+ and a transistion collector region 14 having moderate n doping. A superlattice base region 16 includes an plurality of alternate layers of an extrinsic layer 18 of p+ conductivity and intrinsic layers 20 of undoped semiconductor material. An emitter region 22 is provided contiguous to the base region 16 of n conductivity. The emitter region 22 may be lightly doped or heavily doped depending on the particular application of the transistor. Heavily doped p+ohmic contacts 24 and 26 are grown on the base region 16.

In the base region 16 each pair of contiguous extrinsic and intrinsic layers 18, 20 forms a period of the superlattice. If the period of the superlattice is sufficiently small, resonant states will result for both electrons and holes across the base region. The range of thickness for each of the layers 18 and 20 has been found to be from 50 to 200 angstroms. In practice, the typical thickness for the period of the superlattice is 100 angstroms. Furthermore, if the relative doping of the superlattice is sufficiently large, there will be large band bending which reduces the energy spacing of the resonant states between the conduction of valence bands.

Figure 2:
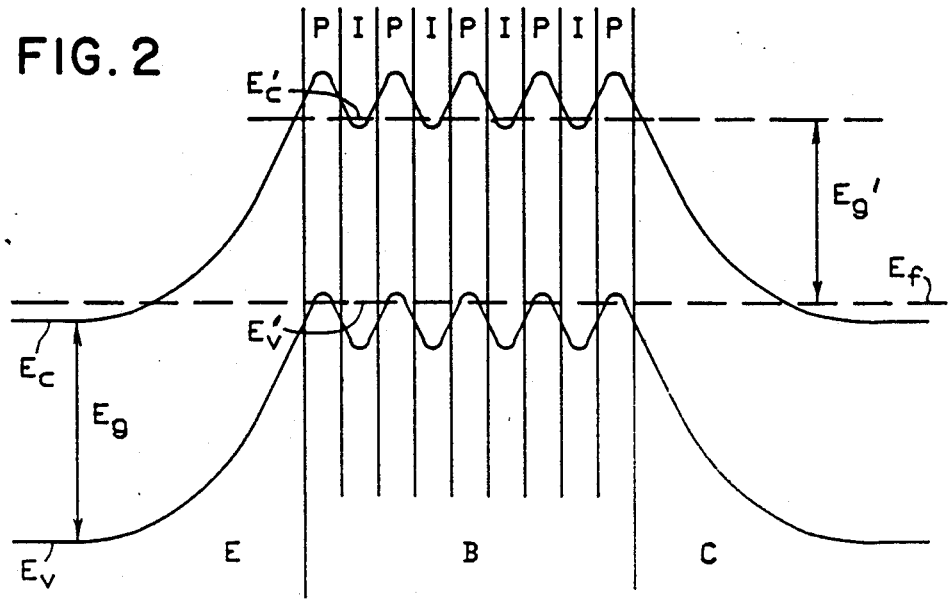
FIG. 2 is an energy band diagram of the transistor of the present invention showing the band bending and effective narrowed base band gap.

FIG. 2 is a schematic energy band diagram for the npn transistor implementation. The conduction energy band is indicated at Ec and the valence energy band is indicated at Ev. The energy gap in the emitter and collector regions is shown as Eg. The ripple in the conduction band and valence band energy levels in the base region is due to the periodically varying doping in the region 16 of FIG. 1. The p+ doped regions are shown with the more positive energy peak and the intrinsic or undoped regions have the less positive energy peak. The lowest resonant states in the conduction band is shown as Ec' and the lowest resonant states in the valence is shown as Ev'. The effective band gap Eg' is equal to Ec'-Ev'. The effective base band gap Eg' is less than the energy gap Eg for the emitter and collector.

In the preferred embodiment, the p+ region of the superlattice will be heavily doped to provide abrupt transitions between the extrinsic and intrinsic layers. The p doping may be in the range of $10^{17}$ to $10^{20}$ with the optimal amount being $10^{20}$. In the fabrication of the superlattice, uniformity of doping levels and thickness of the regions is desirable to provide the maximum band gap reduction. In the preferred embodiment, the thickness of each of the extrinsic layers is substantially the same, and the thickness of each of intrinsic layers is also substantially the same to provide uniform periodic band bending. There is no requirement that the thickness of the extrinsic layers be equal to the thickness of the intrinsic layers. The relative thickness of the extrinsic layers with respect to the intrinsic layers is a design parameter determined by the particular application. Generally, forming the superlattice with thicker intrinsic layers than extrinsic layers will result in a larger band gap reduction. Other considerations include the degree of coupling of the resonant states and the amount of doping. In one embodiment of the invention the device is fabricated with all layers of the supperlattice having the same thickness.

The reduction in the energy gap will be at least a tenth of an electron volt and, depending on the amount of doping and size of the layers, may be as much as several tenths of an electron volt. In principle, the maximum energy gap reduction will be slightly smaller than half of the band gap of the bulk material utilized for the semiconductor. Thus, by way of example, the nominal energy gap for silicon is 1.1 eV and the range to which the band gap may be reduced by the present invention is from 1.0 eV to 0 6 eV.

In fabricating the effective narrow band gap base transistor of the present invention, standard semiconductor techniques may be used such as, molecular beam epitaxy or chemical vapor deposition. In addition, conventional diffusion techniques may be used for doping the emitter base and collector. However, it is preferred that ion implantation be used because of its low temperature environment to maintain the abruptness of the superlattice layers. The formation of the superlattice for the base of the present invention may be made in accordance with the chemical vapor deposition process described in copending B. S. Byerson, U.S patent application Ser. No. 906,854, a co-inventor herein, which application is incorporated herein by reference. Briefly, the aforementioned Meyerson process permits in-situ CVD doping of silicon epilayers at temperatures below 550° C. The process is especially useful for forming thin, high quality monocrystalline silicon layers on a substrate. The ability to dope the layers in-situ to any desired level allows the superlattice of the invention to be fabricated in a single CVD process.

Figure 3:
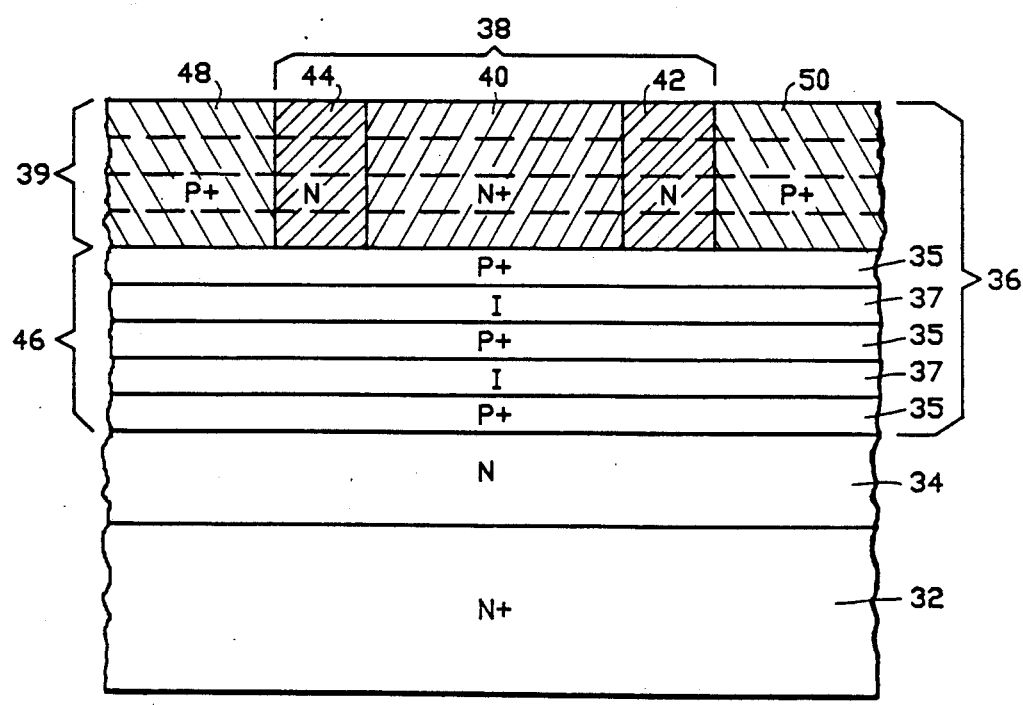
FIG. 3 is a cross-sectional schematic view of the bipolar effective narrow gap base transistor formed by the novel implementation method of the present invention.

Referring now to FIG. 3, a novel implementation of the effective narrow band gap base transistor of the present invention is schematically shown therein. The structure 30 of FIG. 3 includes collector regions 32 and 34 grown by any known technique. Superlattice region 36 is formed on layer 34 by, for example, the process described in the aforementioned Meyerson application. The superlattice includes alternate p+ doped layers 35 and undoped layers 37. An emitter region is formed in the superlattice region by converting a lengthwise central portion 38 of several of the upper layers 39 of the superlattice to the opposite conductivity of the extrinsic layers 35 of the superlattice. The emitter region is converted by heavily doping the region 38 by, for example, ion implantation. In order to convert to region 38 to n+ from p+, the amount of doping introduced into region 38 must be higher than the doping level of layers 35. Thus, if layers 35 have a doping level of about $10^{17}$ cm$^{-3}$, then region 18 should have a doping level of above $10^{18}$ cm$^{-3}$. Preferably, a portion 40 of the region 38 is heavily doped n+ and side portions 42 and 44 are moderately n doped to act as emitter-base isolation spacer layers.

The remaining layers of the superlattice in region 46 then define the base of the transistor of the invention. The side portions 48 and 50 on either side of the emitter region 38 are converted to p+ regions to act as ohmic contacts to the base. The doping of the upper layers 39 of the superlattice removes the superlattice nature of those layers and converts those layers into a homogeneous region. The energy bands of the homogeneous regions become uniform and the band gap returns to the original band gap of the bulk material. The transistor 30 is fabricated by forming the emitter region within the superlattice eliminating the need to grow additional emitter and ohmic contact regions on the superlattice.

The effective narrow band gap base transistor of the present invention has an equivalent wide band gap emitter having a higher emitter efficiency. The transistor allows for the possibility of having a lightly doped emitter thereby providing a small emitter to base capacitance. This can be realized since there is no longer a need to heavily dope the emitter to prevent holes from moving from the base to the emitter. In addition, the heavy doping in the periodically doped base region reduces base resistance.

The transistor of the present invention also provides two dimensional (2D) confinement in the base region that lowers the lateral base resistance. The 2D confinement results in carriers being essentially confined to flow laterally in the individual layers.

Other advantages of the transistor of the present invention are realized in the long minority lifetime due to the spatial separation of the majority and minority carriers. In addition, the device eliminates current crowding. Moreover, since the base region can be fabricated with heavily doped P+IP+I... superlattice, it can thus be operated at low temperatures because there would be no carrier freeze-out effect. The transistor performance and packing density can therefore be improved.

While the invention has been particularly shown and described with respect to preferred embodiments thereof, it will be understood by those skilled in the art that the foregoing and other changes in form and detail may be made therein without departing from the spirit and scope of the invention which should be limited only by the scope of the appended claims.

What is claimed is:

1. A bipolar transistor comprising:
a homojunction semiconductor body having:
an emitter and collector region of a first conductivity type separated by a base region, at least an intrinsic base of said base region comprising a superlattice of a plurality of alternate layers of an extrinsic layer of a second conductivity type and an intrinsic layer, each of said emitter, base and collector regions being made of the same semiconductor material, said intrinsic base being that that portion of the base region which lies directly between the emitter region and the collector region and through which carriers which are minority carriers in said base region pass from said emitter region to said collector region if a forward bias is applied between said emitter region and said base region;
said extrinsic layer having a doping level sufficiently high such that the effective band gap of said semiconductor in said base region is reduced with respect to the band gap of said semiconductor at least in said emitter region.

2. The transistor of claim 1 wherein the base, collector and emitter semiconductor material is one of silicon, germanium and gallium arsenide.

3. The transistor of claim 1 wherein the semiconductor material is one of monocrystalline silicon and monocrystalline germanium.

4. The transistor of claim 1 wherein said superlattice further includes a portion other than said intrinsic base to which an ohmic connection is made.

5. The transistor of claim 2 wherein the emitter and collector have n conductivity and the base extrinsic layers have a p conductivity.

6. The transistor of claim 2 wherein the emitter and collector have a p conductivity and the base extrinsic layers have a n conductivity.

7. The transistor of claim 2 wherein the effective band gap of the base region is reduced by 0.1 eV or greater.

8. The transistor of claim 7 wherein the effective band gap of the base region is reduced in the range between 0.1 eV to one-half the band gap of the bulk semiconductor material.

9. The transistor of claim 1 wherein thickness of the alternate layers of extrinsic and intrinsic layers is in the range between 50 to 200 angstroms.

10. The transistor of claim 9 wherein thickness of the alternate layers is about 50 angstroms.

11. The transistor of claim 9 wherein thickness of each of the extrinsic and intrinsic layers is substantially equal.

12. The transistor of claim 9 wherein each of the extrinsic layers have a first thickness and each of the intrinsic layers have a second thickness different from said first thickness.

13. The transistor of claim 2 wherein the alternate layers of extrinsic and intrinsic layers have a steep transition in energy in both the conduction and valence bands.

14. The transistor of claim 1 wherein the extrinsic layers of said second conductivity type have a doping level in the range between $10^{17}$ to $10^{20}$ cm$^{-3}$.

15. The transistor of claim 14 wherein the doping level of the extrinsic layers is about $10^{20}$ cm$^{-3}$.

16. A homojunction bipolar transistor comprising:
a silicon semiconductor body having:
an emitter and a collector region of a first conductivity type separated by a base region, at least an intrinsic base of said base region comprising a superlattice of a plurality of alternate layers of an extrinsic layer of a second conductivity type and an intrinsic layer, said intrinsic base being that portion of the base region which lies directly between the emitter region and the collector region and through which carriers which are minority carriers in said base region pass from said emitter region to said collector region if a forward bias is applied between said emitter region and said base region;
said extrinsic layer having a doping level sufficiently high to provide a steep transition in energy in both the conduction and valence bands such that the effective band gap of said semiconductor in said base region is reduced with respect to the band gap of said semiconductor at least in said emitter region.

17. The transistor of claim 16 wherein the silicon semiconductor body is made of monocrystalline silicon.

18. The transistor of claim 16 wherein the extrinsic layers in the base region have a doping level in the range between $10^{17}$ to $10^{20}$ cm$^{-3}$.

19. The transistor of claim 18 wherein said superlattice further includes a portion other than said intrinsic base to which an ohmic connection is made.

20. The transistor of claim 16 wherein the thickness of the extrinsic and intrinsic layers is in the range between 50 to 200 angstroms.

21. The transistor of claim 20 wherein the thickness of the extrinsic and intrinsic layers is about 50 angstroms.

22. The transistor of claim 21 wherein the thickness of the extrinsic and intrinsic layers is substantially equal.

23. The transistor of claim 21 wherein each of the extrinsic layers has a first thickness and each of the intrinsic layers has a second thickness different from said first thickness.

* * * * *